(12) United States Patent
Stecher

(10) Patent No.: US 6,525,383 B1
(45) Date of Patent: *Feb. 25, 2003

(54) POWER MOSFET

(75) Inventor: Matthias Stecher, Villach (AT)

(73) Assignee: Siemens Aktiengesellschaft, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 09/023,958

(22) Filed: Feb. 17, 1998

(30) Foreign Application Priority Data

Feb. 14, 1997 (DE) .......................... 197 05 791

(51) Int. Cl.⁷ .................. H01L 29/76; H01L 29/94; H01L 31/062; H01L 31/113; H01L 31/119
(52) U.S. Cl. ........................ 257/401; 257/341
(58) Field of Search ................. 257/270, 336, 257/341, 343, 346, 401, 408, 409

(56) References Cited

U.S. PATENT DOCUMENTS

| | | | | |
|---|---|---|---|---|
| 3,624,466 A | * | 11/1971 | Schnable | 257/406 |
| 3,787,962 A | * | 1/1974 | Yoshida et al. | 257/401 |
| 3,909,320 A | * | 9/1975 | Gauge et al. | 257/389 |
| 3,967,305 A | * | 6/1976 | Zuleeg | 257/265 |
| 4,394,674 A | * | 7/1983 | Sakuma et al. | 257/336 |
| 4,876,579 A | * | 10/1989 | Davis et al. | 257/270 |
| 5,637,891 A | * | 6/1997 | Lee | 257/215 |

OTHER PUBLICATIONS

"Bauelemente der Halbleiter–Elektronik", Fourth Edition, Berlin, 1991, pp. 165–167.
"VLSI Technology", McGraw–Hill, 1998, pp. 481–482.

* cited by examiner

Primary Examiner—Long Pham
Assistant Examiner—Dana Farahani
(74) Attorney, Agent, or Firm—Laurence A. Greenberg; Werner H. Stemer; Ralph E. Locher

(57) ABSTRACT

A power MOSFET includes a drain zone which is disposed centrally in a substrate and is annularly surrounded by a lightly doped region of the same conductivity type as the drain zone. The lightly doped region is in turn annularly surrounded by a source zone. A gate electrode is also annular in shape and has an inner edge that overlaps the lightly doped region and an outer edge which overlaps the source zone.

6 Claims, 3 Drawing Sheets

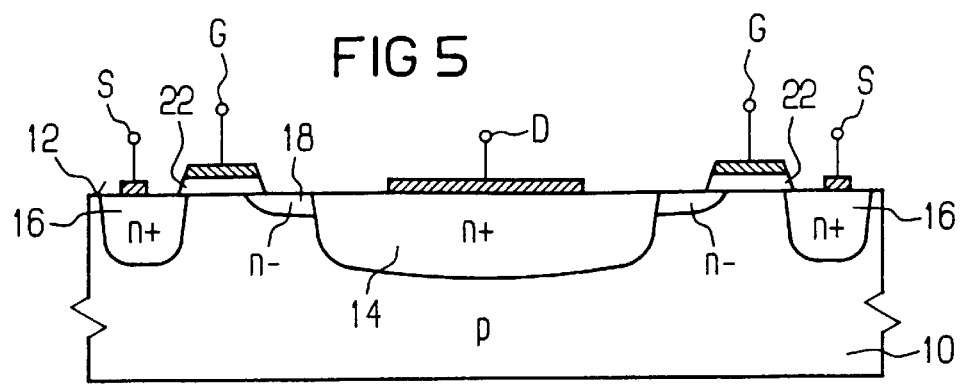
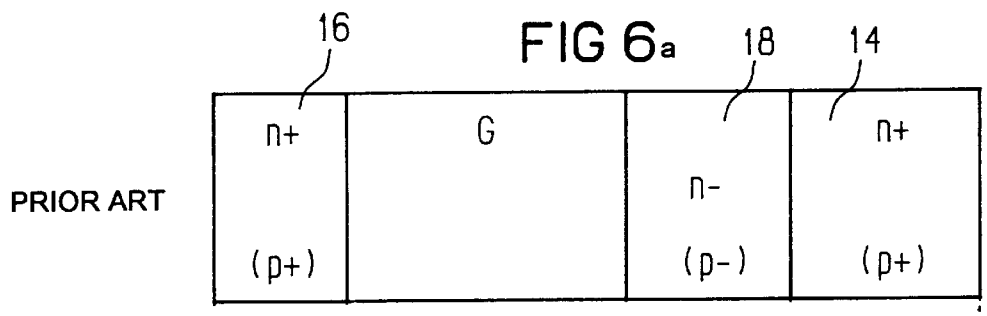
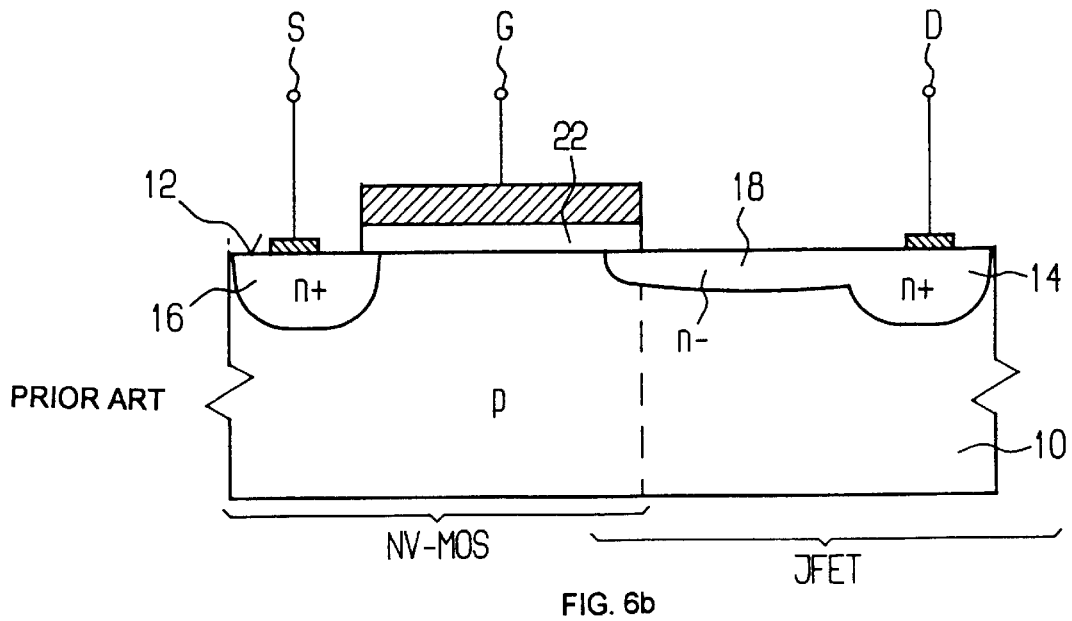

POWER MOSFET

BACKGROUND OF THE INVENTION

1. Field of the Invention

The invention relates to a power MOSFET which includes a substrate with an upper main surface; a drain zone of a first conductivity type is embedded in the main surface and contacted by a drain electrode; a source zone of the first conductivity type is embedded in the main surface and contacted by a source electrode, the source zone is surrounded by a region of a second conductivity type; a region of the first conductivity type is lightly doped in comparison with the drain zone and extends from the drain zone in the direction of the source zone; and a gate electrode is seated above the main surface on an insulation layer and peripherally overlaps both the source zone and the lightly doped region.

One such power MOSFET is shown, for instance, in the book by R. Müller entitled "Bauelemente der Halbleiter-Elektronik" [Semiconductor Electronics Components], Fourth Edition, Berlin, 1991, pp. 165–167 and FIG. 3/19 therein. The power MOSFET, for instance, has a p-substrate, in which two n⁺-doped wells are embedded and spaced apart from one another, for forming a source zone and a drain zone. The source zone is surrounded by a p-doped well, in which a channel can develop.

The n⁺-doped drain zone is adjoined by an n-doped region. A gate electrode which is above the main surface of the substrate, is separated from the main surface of the substrate by an insulation layer. Edges of the gate electrode overlap both the source zone and the drain zone.

During operation of such high-voltage MOS components, problems leading to damage of the component can arise. One of the main problems is the generation of so-called hot charge carriers ("hot carriers" or "hot electrons"). Hot charge carriers occur particularly in MOS components of the kind in which a high voltage is applied between the drain and the source, or in other words including power MOS components. Given an existing high electrical field, the hot charge carriers can absorb so much energy that they overcome the semiconductor/oxide barrier of approximately 3.1 eV and thereby damage the oxide. As a result, the electrons inside the channel of the MOSFET are made capable of recovering enough energy to reach the insulation layer under the gate or in other words to get into the gate oxide. In the most harmless case, it worsens the component by changing its characteristics. In the worst case, it renders the component nonfunctional.

In order to solve that problem, it is known, for instance, from the book entitled "VLSI Technology", McGraw-Hill, 1988, pp. 481, 482, to attach a lightly doped region to the drain zone in the direction of the gate electrode, wherein that region has the same conductivity type as the drain zone but is more lightly doped. Through the use of such a lightly doped region, the electrical field in the drain zone is reduced, and as a result the electrons are prevented from being injected energetically enough into the gate oxide.

That initial solution to the problem is described in detail below in conjunction with FIG. 6 in terms of a previously known power MOSFET. The drain feedthrough in the JFET of the power MOSFET is attained solely by way of the length of the lightly doped region, which naturally markedly lessens the packing density of high-voltage MOS components.

SUMMARY OF THE INVENTION

It is accordingly an object of the invention to provide a power MOSFET, which overcomes the hereinafore-mentioned disadvantages of the heretofore-known devices of this general type, which has a high electric strength and which in comparison with the previous power MOSFET can be produced with a higher packing density on a silicon wafer. In other words, while the electric strength should remain the same, it should be possible to realize the power MOSFET with a smaller silicon surface area.

With the foregoing and other objects in view there is provided, in accordance with the invention, a power MOSFET, comprising a substrate with an upper main surface; a drain zone of a first conductivity type embedded in the main surface and disposed centrally in the substrate; a drain electrode contacting the drain zone; a source zone of the first conductivity type embedded in the main surface; a region of a second conductivity type surrounding the source zone; a source electrode contacting the source zone; a region of the first conductivity type being lightly doped in comparison with the drain zone, the lightly doped region extending from the drain zone in the direction of the source zone, the lightly doped region annularly surrounding the drain zone and annularly surrounded by the source zone; an insulation layer; and an annularly shaped gate electrode seated above the main surface on the insulation layer and having an inner edge peripherally overlapping the lightly doped region and an outer edge peripherally overlapping the source zone.

In accordance with another feature of the invention, the substrate is formed of a semiconductor material of the second conductivity type; the lightly doped region is embedded in the substrate; and the source zone is surrounded by the substrate.

In accordance with a further feature of the invention, the first conductivity type is n-doped and the second conductivity type is p-doped, or the first conductivity type is p-doped and the second conductivity type is n-doped.

In accordance with an added feature of the invention, the drain zone disposed centrally in the substrate has an oval contour with a deactivated strip portion.

In accordance with an additional feature of the invention, the strip portion is formed of an insulation layer having a thickness of greater than approximately 200 nm.

In accordance with yet another feature of the invention, at at least one of the lightly doped region, the gate electrode and the source zone is disposed in an oval or ellipse around the drain zone.

In accordance with a concomitant feature of the invention, the at least one of the annular structures has a circular-annular form or a polygonal form.

Other features which are considered as characteristic for the invention are set forth in the appended claims.

Although the invention is illustrated and described herein as embodied in a power MOSFET, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 5 is a sectional view through the power MOSFET, which is taken along a line V—V of FIG. 3, in the direction of the arrows; and FIGS. 6a and 6b are respective plan and sectional views through a power MOSFET of the prior art.

DESCRIPTION OF THE PREFERRED EMBODIMENTS

Figure 1:
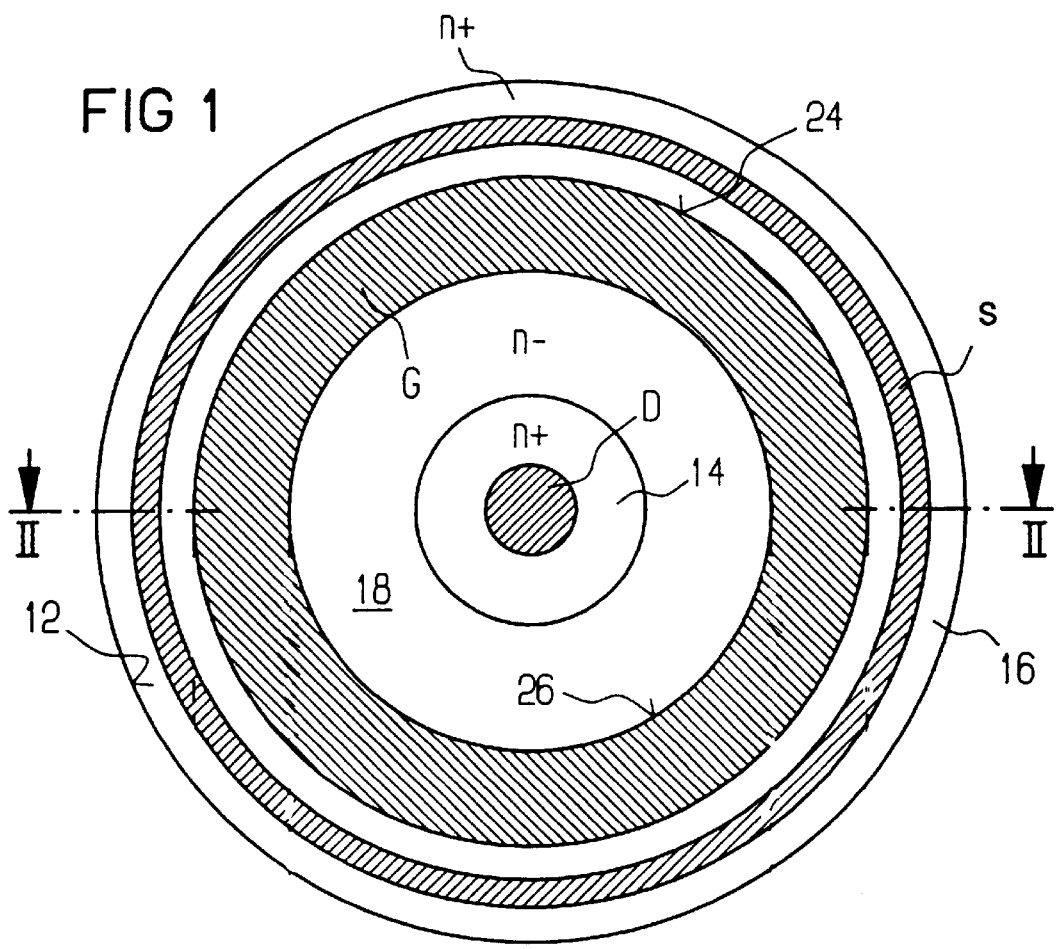
FIG. 1 is a diagrammatic, plan view onto an upper main surface of a first power MOSFET according to the invention.

Referring now in detail to the figures of the drawings, in which unless otherwise indicated the same reference numerals represent identical parts with the same meaning, and first, particularly, to FIGS. 6a and 6b thereof, there is seen a plan view and a sectional view of an exemplary embodiment of a previously known power MOSFET.

An $n^+$-doped region for forming a source zone 16 is connected to a source electrode S and is embedded in a p-doped substrate 10. An $n^+$-doped region for forming a drain zone 14 is contacted by a drain electrode D and is also embedded in the substrate 10. A shallower n-doped region 18 extends from this drain zone 14 in the direction of the source zone 16. A gate electrode G, under which an insulation layer 22 is located, overlaps the source zone 16 somewhat with its left-hand edge, while it overlaps the lightly doped region 18 somewhat with its right-hand edge.

It is essential in this known configuration that the power MOS component has a striplike structure, as seen from above. In principle, the power MOSFET includes a low-voltage MOSFET with a junction FET, which is connected to it and is referred to as a JFET for short. The lightly doped region, which is necessary in conjunction with the avoidance of hot charge carriers, is realized in this exemplary embodiment by the lightly n-doped region 18.

In the exemplary embodiment of FIGS. 6a and 6b, the electric strength becomes higher as the lightly doped n region that adjoins the drain zone 14 becomes longer, or in other words as the n-doped region 18 becomes longer. A decisive factor in minimizing or avoiding hot charge carriers is thus the channel length of the JFET, which is realized by the lightly doped region 18 and determines the drain feedthrough or conductivity to the channel terminal toward the drain (equal to the drain of the low-voltage MOSFET), or in other words it determines the voltage reduction along the lightly doped region. If this drain feedthrough is slight, then the low-voltage MOSFET, as is indicated in FIGS. 6a and 6b, is only stressed with a slight voltage, and as a result fewer hot charge carriers are generated. Heretofore, the drain feedthrough in the JFET of the power MOSFET was attained solely by way of the length of the lightly doped region, which naturally markedly lessened the packing density of high-voltage MOS components.

Figure 2:
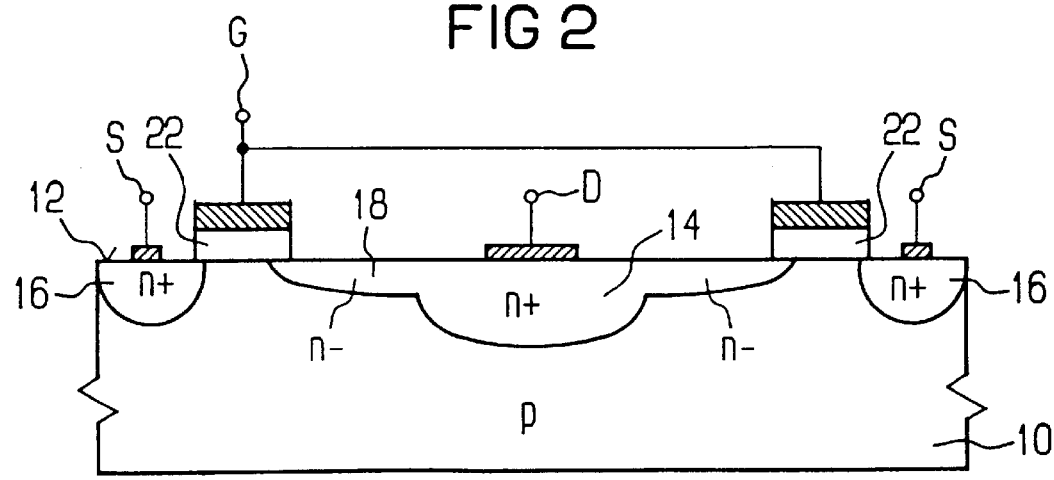
FIG. 2 is a sectional view through the power MOSFET, which is taken along a line line II—II of FIG. 1, in the direction of the arrows.

FIG. 1 shows a plan view of a semiconductor chip and FIG. 2 shows an associated sectional view taken along a line II—II in FIG. 1, for a first exemplary embodiment of a power MOSFET according to the invention. The power MOSFET has a circular-annular structure on its upper main surface 12, with a centrally disposed drain zone 14 which is $n^+$- doped. This drain zone 14 is contacted in the center by a drain electrode D. The $n^+$-doped drain zone 14 is embedded in a p-doped substrate 10 in the manner of a well. The drain zone 14 is circular-annularly surrounded by an n-doped region 18. This lightly doped region 18 has a lesser depth than the drain zone 14, beginning at the upper main surface 12 of the substrate 10. An $n^+$-doped region that is spaced apart from the outer boundary of the lightly doped region 18, forms a source zone 16 which is annularly embedded in the substrate 10. This source zone 16 is contacted by an annular source electrode S.

An annular insulation layer 22, which is designated as a gate oxide and over which an annular gate electrode G is located, is disposed above an intermediate space between facing edges of the source zone 16 and the lightly doped region 18. This insulation layer 22 has a thickness of approximately 80 nm, for instance. The gate electrode G and the insulation layer 22 have an inner edge 26 which overlaps the lightly doped region 18 and an outer edge 24 which overlaps the source zone 16.

The total drain feedthrough of the JFET, that is of the lightly doped region 18, is reduced through the use of this kind of annular, in this case circular-annular, structure of the power MOSFET. This reduces the electrical field beneath the gate electrode, so that the risk of generating hot charge carriers is reduced if not even precluded.

Although in FIGS. 1 and 2 specific conductivity types for the substrate 10, drain zone 14, source zone 16 and lightly doped region 18 have been concretely mentioned, it is understood that instead of the conductivity types shown there, precisely the opposite conductivity types can also be employed in each case. Then p dopings can be used instead of the n dopings shown there, and vice versa. This changes the polarity of the power MOSFET to be made.

It has been repeatedly said in conjunction with FIGS. 1 and 2 that the central drain zone 14 is circular-annular in shape and is surrounded by a circular-annular lightly doped region 18 as well as a circular-annular gate electrode G and a circular-annular source zone 16. The power MOS component of the invention is not limited thereto. Instead of the circular-annular shape, it is understood that any oval form may also be chosen. Instead of a circular-annular or oval structure, a polygonal structure can also be chosen. In that case then, a drain zone with a square contour is possible, surrounded by a square lightly doped region seen from above on the semiconductor body. It can be adjoined by a square gate electrode and a square source zone surrounding it. Instead of a square, an octagon or the like may also be chosen. The central disposition of the drain zone 14 and the parts disposed in a ring around it: the lightly doped region 18, the gate electrode G and the source zone S, in whatever way, is essential for the power MOS component of the invention.

Figure 3:
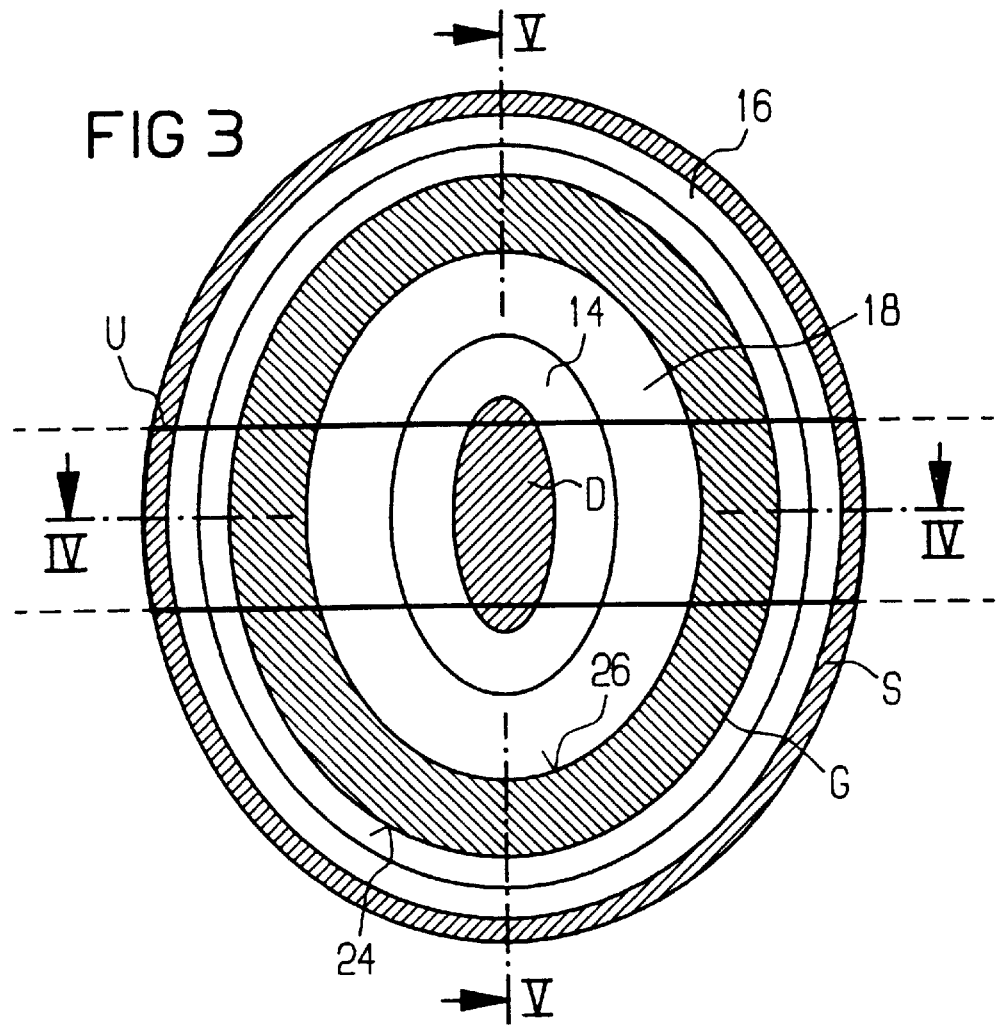
FIG. 3 is a plan view onto an upper main surface of a second power MOSFET according to the invention.
Figure 4:
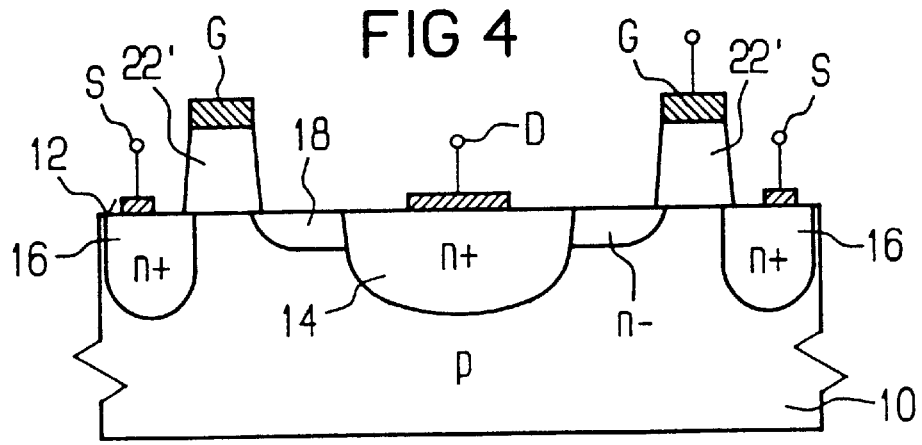
FIG. 4 is a sectional view through the power MOSFET, which is taken along a line IV—IV of FIG. 3, in the direction of the arrows.

FIGS. 3–5 show a second exemplary embodiment of a power MOSFET according to the invention is shown. As FIG. 3 shows, this exemplary embodiment differs in that the structures are now approximately oval or elliptical rather than circular-annular, as seen in a plan view on the semiconductor body.

As is seen from above onto the semiconductor body, this body is divided into two spaced-apart semicircular components and a middle strip portion joining them. For the sake of greater clarity, the strip portion is represented in FIG. 3 by a boundary U, which is present only for purposes of illustration. The gate electrode G, the drain electrode D and the source electrode S continue in this stripped portion, as shown.

However, in order to ensure that this strip portion will not have a negative impact, it is deactivated in a manner which is described below and shown in FIG. 4. The insulation layer 22 (see FIG. 5) seated under the gate electrode G, which may be about 80 nm thick as noted, is thickened in such a way that a transistor function in the strip portion is no longer possible. For instance, the insulation layer may be made with a thickness greater than about 200 nm, for example 1200 nm thick. This thickened insulation layer is assigned reference numeral 22' in FIG. 4, which shows a sectional view along the line IV—IV of FIG. 3. However, the function of the power MOSFET remains the same, since the two "semicircular parts" are connected parallel through the use of the metallizations extended along the strip portion.

Another, non-illustrated, option for deactivating the strip portion is to omit the source electrodes and/or the source zone 18 from the strip portion. In the strip portion, for instance, the aforementioned thickened insulation layer 22' can extend as far as the edge of the semiconductor body.

I claim:

1. A power MOSFET, comprising:
    an oval or elliptical semiconductor body, including:
        two spaced-apart semicircular components;
        a middle strip portion joining said two semicircular components;
        a substrate with an upper main surface;
        a drain zone of a first conductivity type embedded in said main surface and disposed centrally in said substrate;
        a drain electrode contacting said drain zone;
        a region of the first conductivity type being lightly doped in comparison with said drain zone, said region having an outer boundary, said region surrounding said drain zone and having less depth from said main surface than said drain zone;
        a source zone of the first conductivity type embedded in said main surface and spaced apart from said outer boundary of said region defining an intermediate space therebetween;
        a region of a second conductivity type surrounding said source zone;
        a source electrode contacting said source zone;
        an insulation layer disposed above said intermediate space between said outer boundary of said region and an inner boundary of said source zone;
        a gate electrode disposed on said insulation layer, said gate electrode and said insulation layer having an inner edge peripherally overlapping said lightly doped region and an outer edge peripherally overlapping said source zone;
        said strip portion being deactivated by forming the portion of said insulation layer within said strip portion with a thickness significantly greater than a thickness of the remaining portion of said insulation layer; and
        said source electrode, said source zone, said gate electrode and said insulation layer, said lightly doped region, said drain zone and said drain electrode each being in oval or elliptical shape and surrounding one another.

2. The power MOSFET according to claim 1, wherein said substrate is formed of a semiconductor material of the second conductivity type; said lightly doped region is embedded in said substrate; and said source zone is surrounded by said substrate.

3. The power MOSFET according to claim 1, wherein the first conductivity type is n-doped and the second conductivity type is p-doped.

4. The power MOSFET according to claim 1, wherein the first conductivity type is p-doped and the second conductivity type is n-doped.

5. The power MOSFET according to claim 1, wherein said portion of said insulation layer within said strip portion has a thickness of greater than approximately 200 nm.

6. The power MOSFET according to claim 1, wherein said strip portion is deactivated by omitting a portion of at least one of said source electrode and said source zone within said strip portion.

* * * * *